(12) United States Patent
Ye et al.

(10) Patent No.: US 11,189,517 B2
(45) Date of Patent: Nov. 30, 2021

(54) RF ELECTROSTATIC CHUCK FILTER CIRCUIT

(71) Applicant: Applied Materials, Inc., Santa Clara, CA (US)

(72) Inventors: Zheng John Ye, Santa Clara, CA (US); Edward Haywood, Santa Clara, CA (US); Adam Fischbach, Campbell, CA (US); Timothy Joseph Franklin, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/791,875

(22) Filed: Feb. 14, 2020

(65) Prior Publication Data

US 2020/0343123 A1    Oct. 29, 2020

Related U.S. Application Data

(60) Provisional application No. 62/839,301, filed on Apr. 26, 2019.

(51) Int. Cl.
*H01L 21/683* (2006.01)
*H01J 37/32* (2006.01)

(52) U.S. Cl.
CPC .... *H01L 21/6833* (2013.01); *H01J 37/32091* (2013.01); *H01J 37/32183* (2013.01)

(58) Field of Classification Search
None
See application file for complete search history.

(56) References Cited

U.S. PATENT DOCUMENTS

2018/0158709 A1    6/2018  Tsuji et al.
2018/0366306 A1*  12/2018  Yang ................ H01J 37/32165

FOREIGN PATENT DOCUMENTS

| JP | H09-018246 A | 1/1997 |
| JP | 2008198902 A | 8/2008 |
| WO | 2017100136 A1 | 6/2017 |

OTHER PUBLICATIONS

International Search Report and Written Opinion for Application No. PCT/US2020/018512 dated Jun. 16, 2020.

* cited by examiner

*Primary Examiner* — Jany Richardson
(74) *Attorney, Agent, or Firm* — Patterson + Sheridan, LLP

(57) ABSTRACT

Embodiments described herein relate to apparatus and methods for substantially reducing an occurrence of radio frequency (RF) coupling through a chucking electrode. The chucking electrode is disposed in an electrostatic chuck positioned on a substrate support. The substrate support is coupled to a process chamber body. An RF source is used to generate a plasma in a process volume adjacent to the substrate support. An impedance matching circuit is disposed between the RF source and the chucking electrode is disposed in the electrostatic chuck. An electrostatic chuck filter is coupled between the chucking electrode and the chucking power source.

21 Claims, 4 Drawing Sheets

RF ELECTROSTATIC CHUCK FILTER CIRCUIT

CROSS-REFERENCE TO RELATED APPLICATIONS

This application claims priority to U.S. Provisional Patent Application No. 62/839,301, filed Apr. 26, 2019, which is hereby incorporated by reference in its entirety.

BACKGROUND

Field

Embodiments of the present disclosure generally relate to semiconductor processing, and more specifically to apparatus and methods to generate and control radio frequency plasma for thin film deposition.

Description of the Related Art

In the fabrication of integrated circuits, deposition processes, such as chemical vapor deposition (CVD), are often used to deposit films of various materials on substrates. In plasma-enhanced chemical vapor deposition (PECVD), for instance, electromagnetic energy is applied to at least one precursor gas or vapor to generate a plasma.

In some examples, the electromagnetic energy used to generate the plasma can be radio frequency (RF) power. However, when RF power is used, capacitive coupling can occur between the plasma and a chucking electrode in an electrostatic chuck. The capacitive coupling results in RF coupling which induces high RF voltage and current on and through the chucking electrode which results in loss of power and damage to a power supply of the chucking electrode.

Accordingly, improved apparatus and methods for RF power application are needed.

SUMMARY

In one embodiment, an apparatus is provided which includes a chamber body and a lid defining a process volume therein. A substrate support is disposed in the process volume. A first electrode is embedded in the substrate support. A radio frequency (RF) source is coupled to the first electrode. An impedance matching circuit is disposed between the RF source and the first electrode. A second electrode is embedded in the substrate support. A power source is coupled to the second electrode. An electrode filter is disposed between and coupled to the second electrode and the power source.

In another embodiment, an apparatus is provided which includes a chamber body and a lid defining a process volume therein. A gas distribution plate is disposed in the process volume and positioned adjacent to the lid. A substrate support is disposed in the process volume. A first electrode is embedded in the substrate support. A radio frequency (RF) source is coupled to the first electrode. An impedance matching circuit is disposed between the RF source and the electrode. A second electrode is embedded in the substrate support. A power source is coupled to the second electrode. An electrode filter is disposed between the second electrode and the power source. The electrode filter includes a first inductor coupled to the second electrode. A second inductor is disposed in series with the first inductor. A third inductor is disposed in series with the first inductor and the second inductor. A resistor is disposed in series with the first inductor, the second inductor, and the third inductor. The resistor is coupled to the power source and a first capacitor is disposed in parallel with the second inductor.

In still another embodiment, an apparatus is provided which includes a chamber body and a lid defining a process volume therein. A gas distribution plate is disposed in the process volume and positioned adjacent to the lid. A substrate support is disposed in the process volume. A first electrode is embedded in the substrate support. A second electrode is embedded in the substrate support between the first electrode and a surface of the substrate support facing the lid. A radio frequency (RF) source is coupled to the first electrode. An impedance matching circuit is disposed between the RF source and the first electrode. A power source is coupled to the second electrode. An electrode filter is disposed between the second electrode and the power source. The electrode filter includes a first inductor coupled to the second electrode, a second inductor in series with the first inductor, a third inductor in series with the first inductor and the second inductor, and a resistor in series with the first inductor, the second inductor, and the third inductor. The resistor is coupled to the power source. The electrode filter also includes a first capacitor in parallel with the second inductor, a first ground path coupled to the electrode filter between the second inductor and the third inductor, and a second ground path coupled to the electrode filter between the third inductor and the resistor. The first ground path includes a second capacitor. The second ground path includes a third capacitor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to apparatus and methods for substantially reducing an occurrence of radio frequency (RF) coupling through a chucking electrode. The chucking electrode is disposed in a substrate support that is coupled to a process chamber body. An RF source is used to generate a plasma in a process volume adjacent to the substrate support. An impedance matching circuit is disposed between the RF source and a chucking electrode disposed in the substrate support. To reduce an occurrence of damage to the chucking electrode and a chucking power source coupled thereto, an electrostatic chuck filter is coupled between the chucking electrode and the chucking power source.

Figure 1:
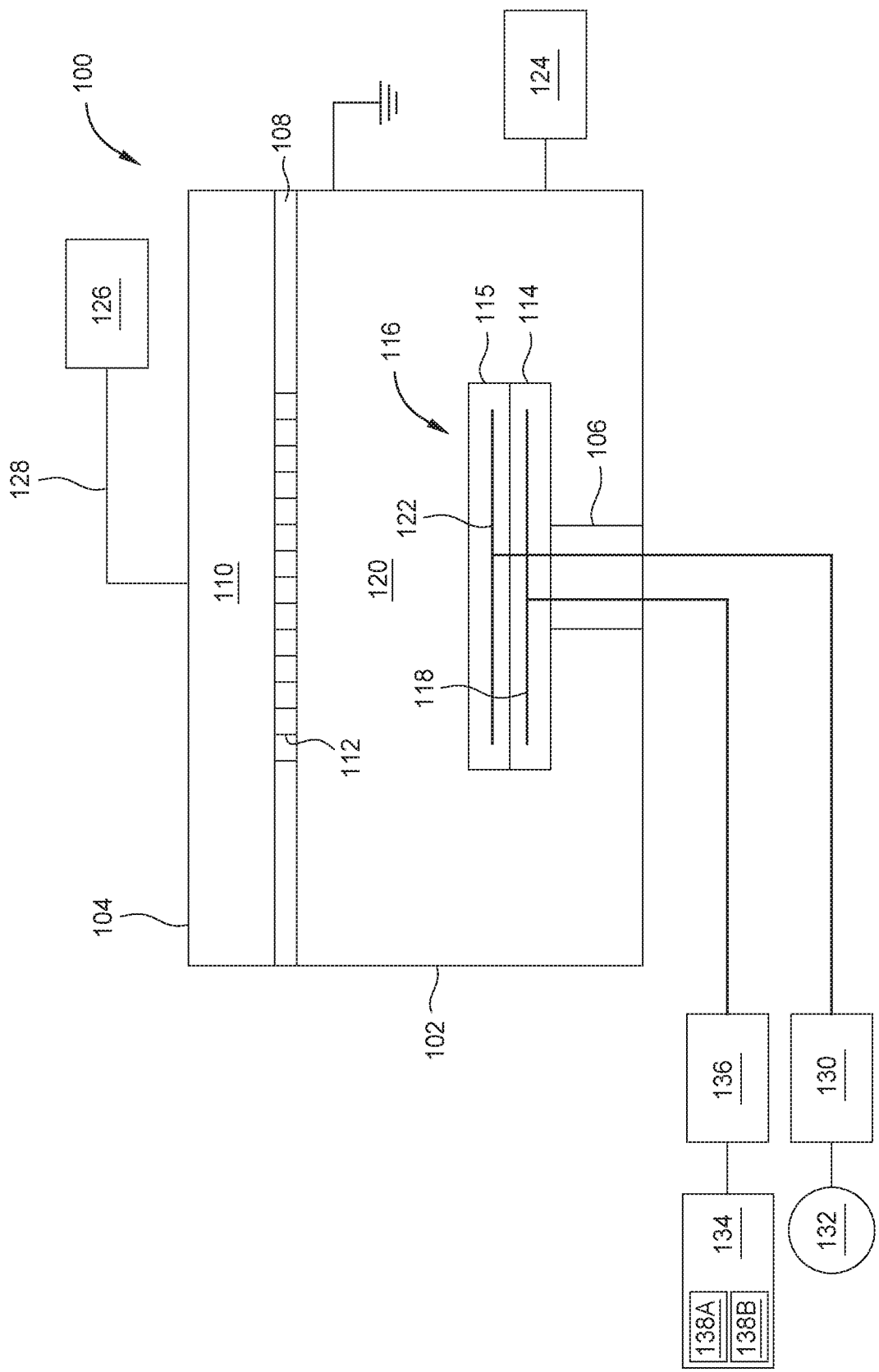
FIG. 1 is a schematic view of a process chamber according to one embodiment.

FIG. 1 is a schematic view of a process chamber 100 according to one embodiment. The process chamber 100 includes a chamber body 102 and a lid 104 defining a process volume 120 therein. A substrate support 114 and a gas distribution plate 108 are disposed in the process volume 120. The substrate support 114 is supported within the chamber body 102 via a stem 106. The substrate support 114 includes one or more conductive plates, insulating plates, facilities plates, cooling channels, and the like to facilitate processing of a substrate. In one embodiment, the stem 106 is substantially normal to the lid 104 and is coupled to the chamber body 102 opposite the lid 104, or disposed through an opening in the chamber body 102 opposite the lid.

In one embodiment, which can be combined with one or more embodiments described above, the substrate support 114 is fabricated from an aluminum containing material. For example, the substrate support 114 can be fabricated from an aluminum nitride material. An electrostatic chuck 115 can be positioned on an upper surface of the substrate support 114 to facilitate chucking of a substrate during processing. The electrostatic chuck 115 includes an electrode 122 disposed therein. In one embodiment, which can be combined with one or more embodiments described above, the electrode 122 is a conductive mesh.

An upper surface 116 of the electrostatic chuck 115 can have a plurality of raised portions (not shown) formed thereon. The raised portions can contact a substrate (not shown) disposed on the upper surface 116 of the electrostatic chuck 115. A gas can be flowed between the substrate and the surface 116 of the electrostatic chuck 115, and/or between the substrate support 114 and a lower surface of the electrostatic chuck, to maintain thermal equilibrium between the substrate and the substrate support 114. In such an example, the fluid can be temperature controlled, for example, via a heat exchanger.

The gas distribution plate 108 is coupled to the chamber body 102. A plenum 110 is defined between the lid 104 and the gas distribution plate 108. The gas distribution plate 108 is disposed opposite the substrate support 114. A plurality of holes 112 is formed through the gas distribution plate 108. The plurality of holes 112 is distributed across the gas distribution plate 108 to facilitate flow of process gas into the process volume 120.

A gas delivery system 126 is coupled to the lid 104 via a delivery line 128. The gas delivery system 126 provides one or more gases to the process chamber 100 for processing a substrate disposed therein. When the one or more gases enter the process chamber 100 through the lid 104, the gases enter the plenum 110 and flow through the plurality of holes 112 in the gas distribution plate 108. The plurality of holes 112 radially distributes the gas across the surface 116 of the electrostatic chuck 115.

An electrode 118 is embedded in the substrate support 114. Radio frequency (RF) power is provided to the electrode 118 via an RF source 134. The RF source 134 is coupled to the electrode 118 via an impedance matching circuit 136. The RF source 134 is capable of providing RF power to the electrode 118 at one or more frequencies simultaneously. For example, the RF source 134 provides RF power to the electrode at a frequency of about 13.56 MHz and at a frequency of about 40 MHz. To do so, the RF source 134 includes a frequency generator 138A, 138B for each frequency. While two frequency generators 138A, 138B are shown, the RF source 134 can include any number of frequency generators for each frequency used. A characteristic impedance of the RF source 134 is about 50 ohms.

The impedance matching circuit 136 enables striking and sustaining of the plasma in the process volume 120. The impedance matching circuit 136 combines the RF signals of various frequencies from the RF source 134. The impedance matching circuit 136 transmits the combined RF signal to the electrode 118 embedded in the electrostatic chuck 115. The combined RF signals are transmitted to the process gas in the process volume 120 to generate a capacitively-coupled plasma therein. The chamber body 102 is coupled to ground and provides an RF return path for facilitating generation of the capacitively-coupled plasma.

In one embodiment, an RF power provided to the electrode 118 is between about 5 kW and about 15 kW, such as between about 8 kW and about 13 kW, for example about 10 kW. An RF current provided to the electrode 118 is between about 120 amps and about 80 amps, such as about 110 amps. The high RF current is enabled by the relatively low resistance of the impedance matching circuit 136 which is between about 0.2 ohms and about 0.40 ohms. A voltage delivered to the electrode 118 is between about 8 kV and about 13 kV, such as about 10 kV. An impedance angle of the impedance matching circuit 136 is between about 85 degrees and about 90 degrees, for example, between about 87 degrees and about 89 degrees.

The electrode 122 is a component of the electrostatic chuck 115 which is disposed on the substrate support 114. A dielectric layer (not shown) can be disposed on the electrostatic chuck 115 and form the surface 116 of the electrostatic chuck 115. A power supply 132 is coupled to the electrode 122 and supplies sufficient power to the electrode 122 to generate an electrostatic force to hold the substrate on the surface 116 of the electrostatic chuck 115. In one embodiment, which can be combined with one or more embodiments described above, the power supply 132 provides direct current (DC) power to the electrode 122.

A coupling capacitance of the electrode 122 is between about 800 pF and about 2500 pF. In one embodiment, which can be combined with one or more embodiments described above, the electrode 122 is fabricated from an aluminum containing material. In one embodiment, which can be combined with one or more embodiments described above, the electrode 122 is disposed between the electrode 118 and the surface 116 of the electrostatic chuck 115.

As the plasma is generated in the process volume 120, RF current travels into the electrode 122 and toward the power supply 132 (e.g., RF leakage). RF current traveling into and through the power supply 132 can damage the power supply 132 which can result in power loss to the electrode and loss of the chucking force applied to the substrate disposed thereon. To prevent damage to the power supply 132, a filter circuit 130 is placed between the power supply 132 and the electrode 122.

The filter circuit 130, such as an RF filter, substantially prevents RF current from traveling to the power supply 132. Thus, the filter circuit 130 substantially reduces an occurrence of damage to the power supply 132 by redirecting the RF current (for example, to ground). The input impedance of the filter circuit 130 is sufficiently high with respect to ground such that minimal current is diverted from the substrate and plasma. However, the impedance of the filter circuit 130 is low enough to substantially prevent current from traveling to the power supply 132.

A controller 124 is coupled to the process chamber 100 to control various aspects of the process performed therein. For example, the controller 124 controls a flow rate of process gas from the gas delivery system 126 to the process volume 120. The controller 124 can also control aspects of loading and unloading the substrate from the process chamber 100. Further, the controller 124 can control aspects of the impedance matching circuit 136 and the filter circuit 130, such as a capacitance of a variable capacitor.

Figure 2A:
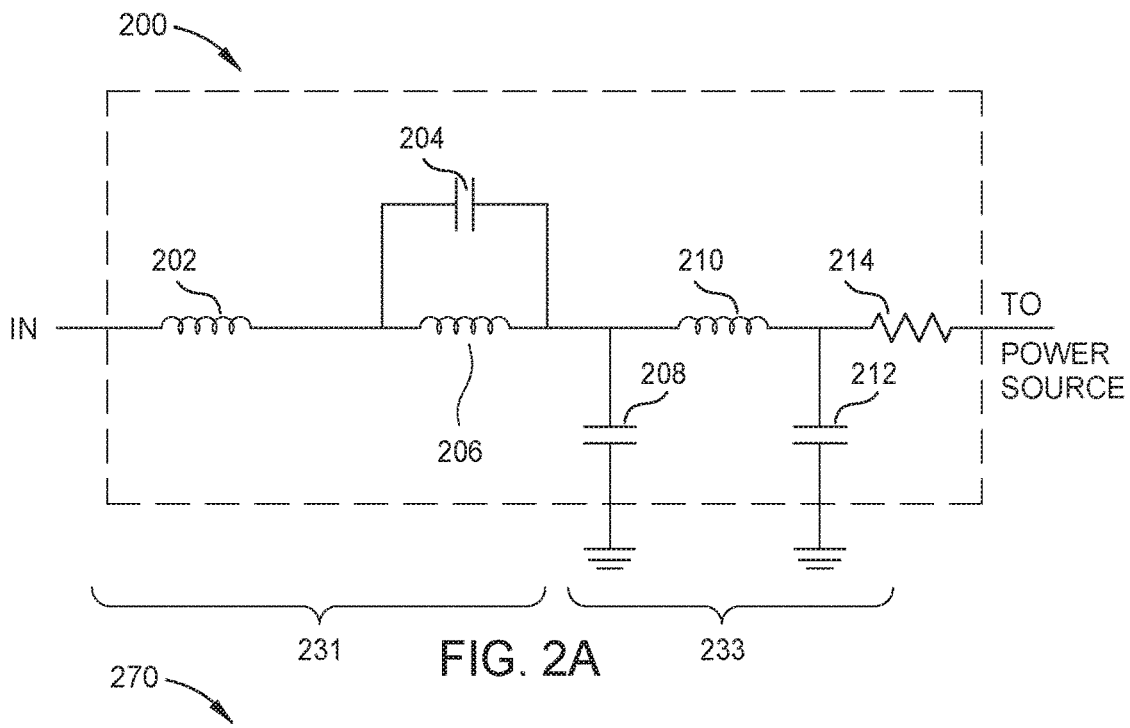
FIG. 2A is a schematic representation of a filter circuit according to one embodiment.

FIG. 2A is a schematic representation of a filter circuit 200 according to one embodiment. The filter circuit 200 can correspond to the filter circuit 130 described with respect to FIG. 1 above. The filter circuit 200 includes a first inductor 202 coupled to an electrode, such as the electrode 122 illustrated in FIG. 1. A second inductor 206 is disposed in series with the first inductor 202. A third inductor 210 is disposed in series with the first inductor 202 and the second inductor 206. A resistor 214 is disposed in series with the first inductor 202, the second inductor 206, and the third inductor 210. The resistor 214 is coupled to a power source, such as the power supply 132 illustrated in FIG. 1.

A first capacitor 204 is disposed in parallel with the second inductor 206. The first capacitor 204 and the second inductor 206 form an L-C resonant circuit. A first ground path includes a second capacitor 208 which is coupled to the filter circuit 200 between the second inductor 206 and the third inductor 210 and coupled to ground. A second ground path includes a third capacitor 212 coupled to the filter circuit 200 between the third inductor 210 and the resistor 214 and coupled to ground. The second capacitor 208 and the third capacitor 212 are shunt capacitors coupled to ground.

A first portion 231 of the filter circuit includes the first inductor 202, the second inductor 206, and the first capacitor 204. The first portion 231 is an inductive portion of the filter circuit 200. Most of the RF current at 13.56 MHz entering the filter circuit 200 is removed by the first inductor 202. Similarly, most of the RF current at 40 MHz is removed by the L-C resonant circuit including the second inductor 206 and the first capacitor 204.

A second portion 233 of the filter circuit 200 is a low-pass filter which includes the second capacitor 208, the third inductor 210, and the third capacitor 212. The resistor 214 is an optional current limiting resistor between the second portion 233 and the power supply. The second portion 233 removes any remaining RF current from the filter circuit 200 to prevent leakage of the RF current into the power supply connected to the resistor 214.

Values of the components (e.g., the first inductor 202, the second inductor 206, the third inductor 210, the first capacitor 204, the second capacitor 208, the third capacitor 212, and the resistor 214) of the filter circuit 200 can be tuned based on one or more frequencies of RF current flowing therethrough. For example, in one embodiment, which can be combined with one or more embodiments described above, the first inductor 202 has an inductance from about 14 µH to about 25 µH, such as about 20 µH, the third inductor 210 has an inductance from about 8 µH to about 13 µH, such as about 10 µH, the second capacitor 208 and the third capacitor 212 have inductances from about 800 pF to about 15000 pF, such as about 1000 pF, and the resistor has a resistance from about 1Ω to about 5Ω, such as about 2Ω.

The resonant L-C circuit, including the first capacitor 204 and the second inductor 206, can have a resonant frequency of 40 MHz. The values of the components in the first portion 231 (e.g., the first inductor 202, the second inductor 206, and the first capacitor 204) can be based on an input frequency of 13.56 MHz. That is, the first portion 231 can be designed to remove RF current at a frequency of 13.56 MHz.

Advantageously, the filter circuit 200 illustrated in FIG. 2A substantially reduces RF current flowing from the electrode 122, illustrated in FIG. 1, to the power supply 132. Thus, the filter circuit 200 substantially reduces an occurrence and an amount of damage to the power supply.

Figure 2B:
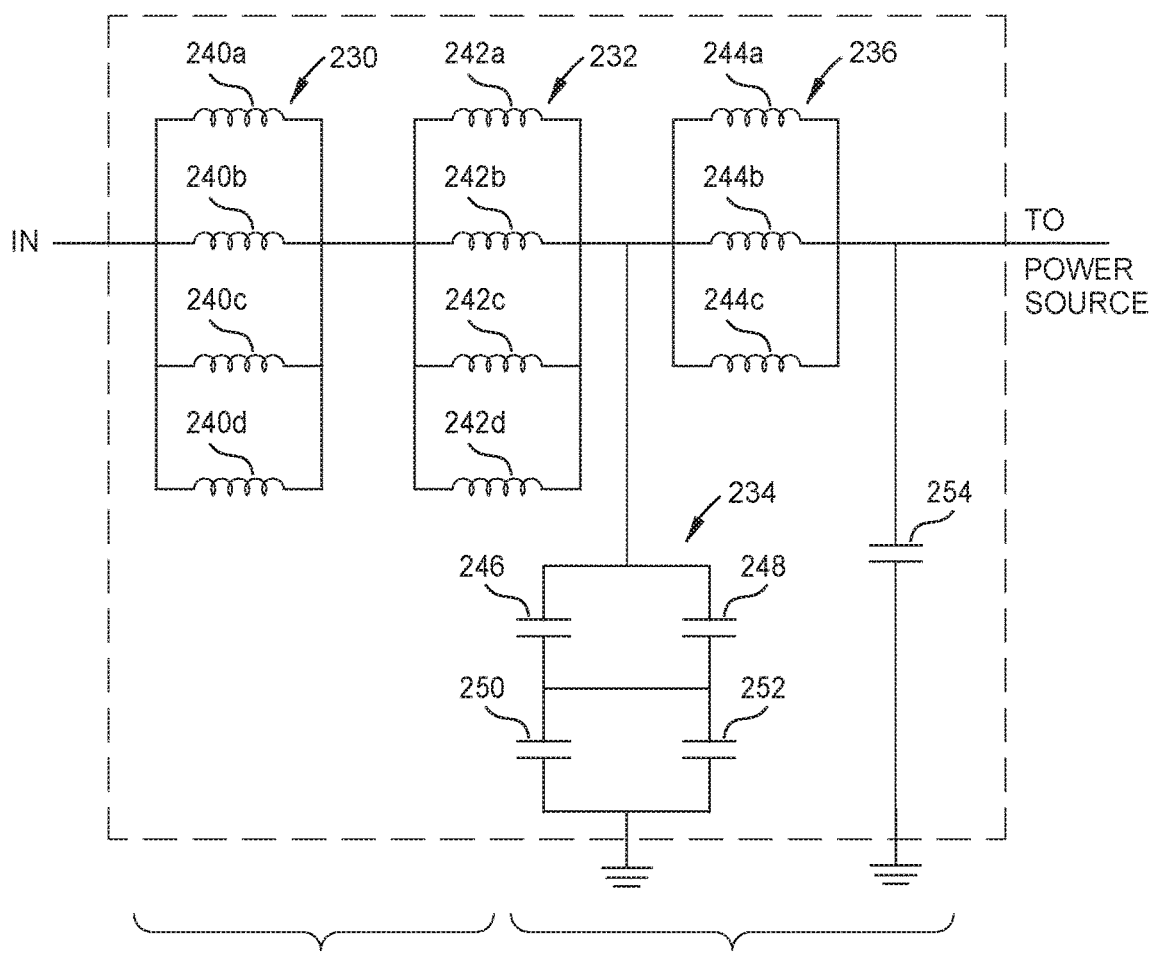
FIG. 2B is a schematic representation of a filter circuit according to one embodiment.

FIG. 2B is a schematic representation of a filter circuit 270 according to one embodiment. The filter circuit 270 can correspond to the filter circuit 130 described with respect to FIG. 1 above. That is, the filter circuit 270 can be an alternative design from the filter circuit 200 described above with respect to FIG. 2A.

The filter circuit 270 includes a first portion 260 and a second portion 262. The first portion 260 includes a first bank of inductors 230 and a second bank of inductors 232 in series. The second portion 262 includes a bank of capacitors 234, a third bank of inductors 236, and a shunt capacitor 254. The bank of capacitors 234 and the shunt capacitor 254 are in parallel. As illustrated, the first bank of inductors 230 includes four inductors 240a, 240b, 240c, and 240d in parallel. The second bank of inductors 232 includes four inductors 242a, 242b, 242c, and 242d in parallel. The first portion 260 of the filter circuit 270 has a combined inductance of 20 µH.

As illustrated, the second portion 262 of the filter circuit 270 is a low pass filter. The bank of capacitors 234 includes four capacitors 246, 248, 250, and 252. The third bank of inductors includes three inductors 244a, 244b, and 244c in parallel. A capacitance of each capacitor 246, 248, 250, 252, and 254 is 1000 pF. An inductance of the third bank of inductors 236 is about 10 µH. The values of the components of the filter circuit 270 can be tuned based on one or more input frequencies to be removed by the filter circuit 270.

Figure 3:
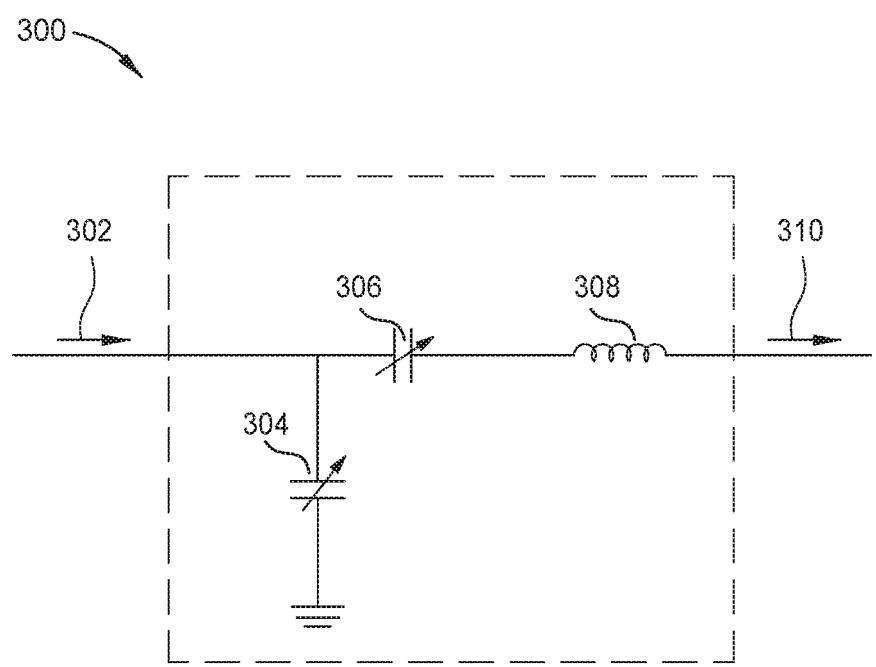
FIG. 3 is a schematic representation of an impedance matching circuit according to one embodiment.

FIG. 3 is a schematic representation of an impedance matching circuit 300 according to one embodiment. The impedance matching circuit 300 includes a first variable capacitor 306 and an inductor 308 in series. A second variable capacitor 304 is coupled to ground and to the impedance matching circuit 300 upstream of the first variable capacitor 306. The impedance matching circuit 300 provides the input impedance of the plasma formed in the process chamber, such as the process chamber 100 described with respect to FIG. 1 above.

Figure 4:
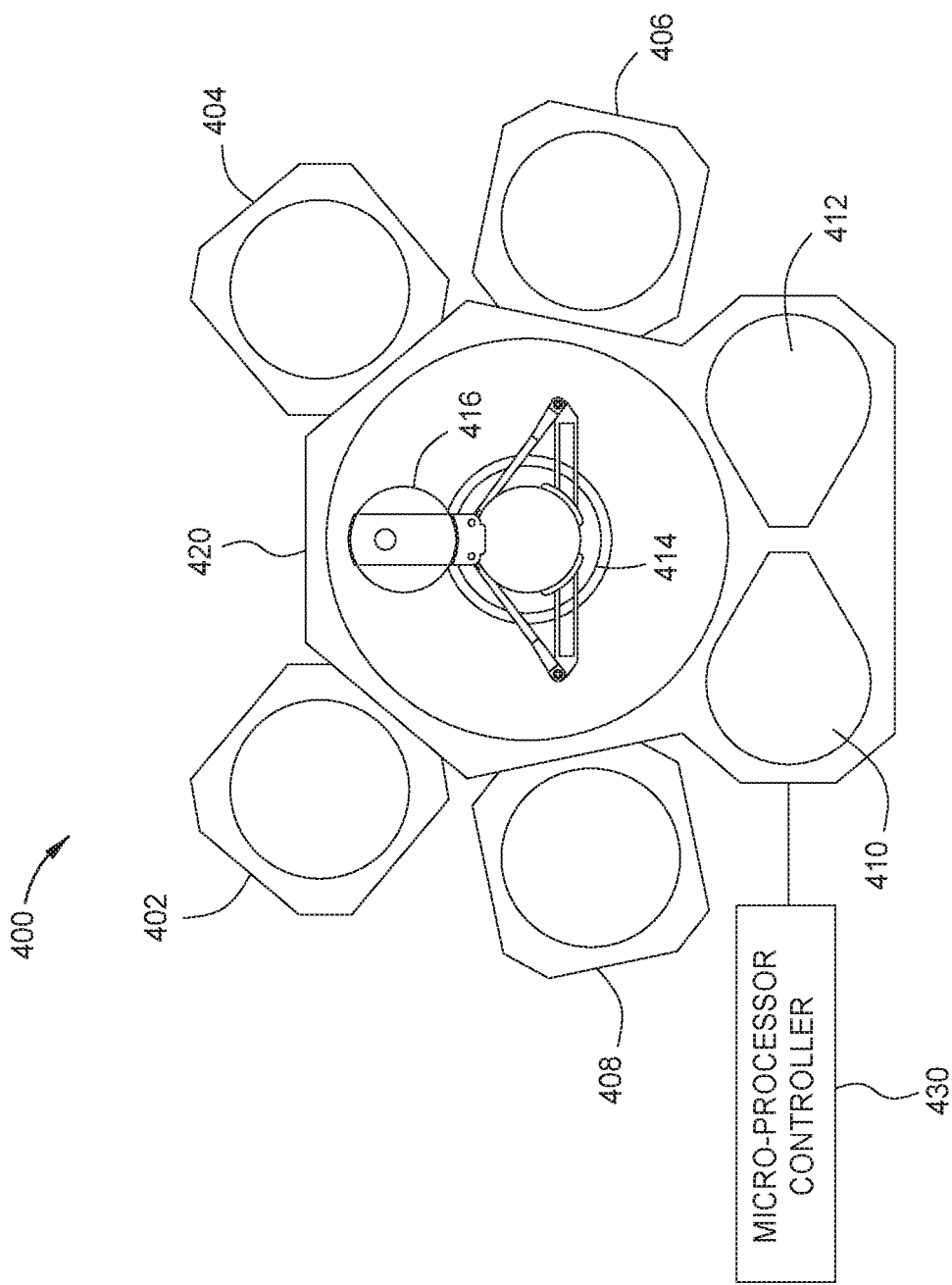
FIG. 4 is a plan view of a cluster tool apparatus according to one embodiment described herein.

FIG. 4 is a plan view of a cluster tool apparatus 400 according to one embodiment described herein. The apparatus 400 includes a plurality of process chambers 402, 404, 406, and 408, a transfer chamber 420, and load lock chambers 410 and 412. Each of the process chambers 402, 404, 406, and 408 is coupled to the transfer chamber 420. While four process chambers 402, 404, 406, and 408 are illustrated in FIG. 4, any number of process chambers can be coupled to the transfer chamber 420.

In one embodiment, which can be combined with one or more embodiments described above, the process chamber 402 is disposed adjacent the process chamber 408. In one embodiment, the process chamber 404 is disposed adjacent the process chamber 402. In one embodiment, which can be combined with one or more embodiments described above, the process chamber 406 is disposed adjacent the process chamber 404. In one embodiment, which can be combined with one or more embodiments described above, each process chamber 402, 404, 406, and 408 corresponds to the process chamber 100 illustrated in FIG. 1.

The transfer chamber 420 enables transfer of the substrate between the load lock chambers 410, 412 and the process chambers 402, 404, 406, and 408. A transfer robot 414 is disposed in the transfer chamber 420. The transfer robot 414 can be a single blade robot or a dual blade robot. The transfer robot 414 has a substrate transport blade 416 attached to a distal end of an extendable arm. The blade 416 is used to support and carry individual substrates between the process chambers 402, 404, 406, and 408. The transfer chamber 420 is maintained under vacuum or an otherwise reduced oxygen environment.

A controller 430 is coupled to the apparatus 400. The controller 430 includes a central processing unit (CPU) (not shown). The controller 430 can be one of any form of a general purpose computer processor that can be used for controlling various process chambers and sub-processors. The controller 430 can be coupled to individual or shared controllers of the process chambers 402, 404, 406, and 408. The controller 430 can control movement of the transfer robot 414 for transporting substrates within the apparatus 400.

In one embodiment, which can be combined with one or more embodiments described above, adjacent process chambers, such as process chambers 402 and 408, have a shared gas delivery system, RF source, controller, and/or vacuum system. These shared systems increase throughput of the processes performed in the process chambers and consistency of deposited films. The shared systems also reduce costs associated with the processes.

Benefits of the disclosure include filter circuits to reduce an amount of RF current (e.g., RF leakage) traveling to and damaging a DC power supply. The filter circuits enable the RF current to be directed away from the DC power supply and back toward the RF source. The filter circuits also prevent an occurrence of power loss to the chucking electrode and loss of chucking force applied to the substrate.

While the foregoing is directed to embodiments of the present disclosure, other and further embodiments of the disclosure may be devised without departing from the basic scope thereof, and the scope thereof is determined by the claims that follow.

What is claimed is:

1. An apparatus, comprising:
    a chamber body and a lid defining a process volume therein;
    a substrate support disposed in the process volume;
    a gas distribution plate coupled to the chamber body and disposed opposite the substrate support;
    a first electrode embedded in the substrate support;
    a radio frequency (RF) source coupled to the first electrode;
    an impedance matching circuit disposed between the RF source and the first electrode;
    a second electrode embedded in the substrate support;
    a power source coupled to the second electrode; and
    an electrode filter disposed between and coupled to the second electrode and the power source.

2. The apparatus of claim 1, wherein the electrode filter comprises:
    a first inductor coupled to the second electrode;
    a second inductor in series with the first inductor;
    a third inductor in series with the first inductor and the second inductor;
    a resistor in series with the first inductor, the second inductor, and the third inductor, the resistor coupled to the power source;
    a first capacitor in parallel with the second inductor;
    a first ground path coupled to the electrode filter between the second inductor and the third inductor, the first ground path comprising a second capacitor; and
    a second ground path coupled to the electrode filter between the third inductor and the resistor, the second ground path comprising a third capacitor.

3. The apparatus of claim 2, wherein the second electrode comprises a conductive mesh.

4. The apparatus of claim 1, wherein the impedance matching circuit comprises:
    a first capacitor;
    an inductor in series with the first capacitor and coupled to the first electrode; and
    a ground path upstream of the first capacitor, the ground path comprising a second capacitor.

5. The apparatus of claim 4, wherein the first capacitor and the second capacitor are variable capacitors.

6. The apparatus of claim 1, wherein the second electrode is disposed between the first electrode and a surface of the substrate support facing the gas distribution plate.

7. An apparatus, comprising:
    a chamber body and a lid defining a process volume therein;
    a gas distribution plate disposed in the process volume and coupled to the chamber body;
    a substrate support disposed in the process volume;
    a first electrode embedded in the substrate support;
    a power source coupled to the first electrode; and
    an electrode filter disposed between the first electrode and the power source, the electrode filter comprising:
        a first inductor coupled to the first electrode;
        a second inductor in series with the first inductor;
        a third inductor in series with the first inductor and the second inductor;
        a resistor in series with the first inductor, the second inductor, and the third inductor, the resistor coupled to the power source; and
        a first capacitor in parallel with the second inductor.

8. The apparatus of claim 7, further comprising:
    a first ground path coupled to the electrode filter between the second inductor and the third inductor, the first ground path comprising a second capacitor; and
    a second ground path coupled to the electrode filter between the third inductor and the resistor, the second ground path comprising a third capacitor.

9. The apparatus of claim 7, wherein the first electrode comprises a conductive mesh.

10. The apparatus of claim 7,
    a second electrode embedded in the substrate support;
    a radio frequency (RF) source coupled to the second electrode; and
    an impedance matching circuit disposed between the RF source and the second electrode.

11. The apparatus of claim 10, wherein the first electrode is disposed between the second electrode and a surface of the substrate support facing the gas distribution plate.

12. The apparatus of claim 10, wherein the impedance matching circuit comprises:
    a fourth capacitor;
    an inductor in series with the first inductor; and
    a ground path upstream of the first capacitor, the ground path comprising a fifth capacitor.

13. The apparatus of claim 12, wherein the fourth capacitor and the fifth capacitor are variable capacitors.

14. An apparatus, comprising:
    a chamber body and a lid defining a process volume therein;

a gas distribution plate disposed in the process volume and positioned adjacent to the lid;
a substrate support disposed in the process volume;
a first electrode embedded in the substrate support;
a second electrode embedded in the substrate support between the first electrode and a surface of the substrate support facing the lid;
a radio frequency (RF) source coupled to the first electrode;
an impedance matching circuit disposed between the RF source and the first electrode;
a power source coupled to the second electrode; and
an electrode filter disposed between the second electrode and the power source, the electrode filter comprising:
a first inductor coupled to the second electrode;
a second inductor in series with the first inductor;
a third inductor in series with the first inductor and the second inductor;
a resistor in series with the first inductor, the second inductor, and the third inductor, the resistor coupled to the power source;
a first capacitor in parallel with the second inductor;
a first ground path coupled to the electrode filter between the second inductor and the third inductor, the first ground path comprising a second capacitor; and
a second ground path coupled to the electrode filter between the third inductor and the resistor, the second ground path comprising a third capacitor.

15. The apparatus of claim 14, wherein the second electrode comprises a conductive mesh.

16. The apparatus of claim 15, wherein the conductive mesh is fabricated from an aluminum containing material.

17. The apparatus of claim 14, wherein the second electrode generates an electrostatic force on the surface of the substrate support.

18. The apparatus of claim 14, wherein the impedance matching circuit comprises:
a fourth capacitor;
an inductor in series with the first inductor; and
a ground path upstream of the first capacitor, the ground path comprising a fifth capacitor.

19. The apparatus of claim 18, wherein the fourth capacitor and the fifth capacitor are variable capacitors.

20. An apparatus, comprising:
a chamber body and a lid defining a process volume therein;
a substrate support disposed in the process volume;
a first electrode embedded in the substrate support;
a radio frequency (RF) source coupled to the first electrode;
an impedance matching circuit disposed between the RF source and the first electrode;
a second electrode embedded in the substrate support;
a power source coupled to the second electrode; and an electrode filter disposed between and coupled to the second electrode and the power source, the electrode filter comprising:
a first inductor coupled to the second electrode;
a second inductor in series with the first inductor;
a third inductor in series with the first inductor and the second inductor;
a resistor in series with the first inductor, the second inductor, and the third inductor, the resistor coupled to the power source;
a first capacitor in parallel with the second inductor;
a first ground path coupled to the electrode filter between the second inductor and the third inductor, the first ground path comprising a second capacitor; and
a second ground path coupled to the electrode filter between the third inductor and the resistor, the second ground path comprising a third capacitor.

21. An apparatus, comprising:
a chamber body and a lid defining a process volume therein;
a substrate support disposed in the process volume;
a first electrode embedded in the substrate support;
a radio frequency (RF) source coupled to the first electrode;
an impedance matching circuit disposed between the RF source and the first electrode, the impedance matching circuit comprising:
a first capacitor;
an inductor in series with the first capacitor and coupled to the first electrode; and
a ground path upstream of the first capacitor, the ground path comprising a second capacitor;
a second electrode embedded in the substrate support;
a power source coupled to the second electrode; and
an electrode filter disposed between and coupled to the second electrode and the power source.

* * * * *